United States Patent
Yang et al.

(10) Patent No.: US 10,038,031 B2
(45) Date of Patent: Jul. 31, 2018

(54) MICRO LIGHT EMITTING DIODE STRUCTURE, PIXEL UNIT, AND LIGHT EMITTING DIODE DISPLAY PANEL

(71) Applicant: AU Optronics Corporation, Hsin-Chu (TW)

(72) Inventors: Wen-Wei Yang, Hsin-Chu (TW); Tsung-Tien Wu, Hsin-Chu (TW); Cheng-Chieh Chang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 42 days.

(21) Appl. No.: 15/408,818

(22) Filed: Jan. 18, 2017

(65) Prior Publication Data

US 2017/0309678 A1    Oct. 26, 2017

(30) Foreign Application Priority Data

Apr. 22, 2016 (TW) .............................. 105112553 A

(51) Int. Cl.
*H01L 27/15* (2006.01)
*H01L 33/24* (2010.01)
*H01L 33/40* (2010.01)

(52) U.S. Cl.
CPC ............ *H01L 27/156* (2013.01); *H01L 33/24* (2013.01); *H01L 33/405* (2013.01)

(58) Field of Classification Search
CPC ....... H01L 33/20; H01L 33/24; H01L 33/405; H01L 27/156
See application file for complete search history.

(56) References Cited

U.S. PATENT DOCUMENTS

| 7,964,881 B2 * | 6/2011 | Choi ..................... H01L 33/20 257/79 |
| 2013/0300812 A1 | 11/2013 | Bibl et al. |
| 2015/0123154 A1 | 5/2015 | Hsu et al. |
| 2016/0018094 A1 | 1/2016 | Bower et al. |
| 2016/0020353 A1 | 1/2016 | Chu |

FOREIGN PATENT DOCUMENTS

| JP | 2003188410 A * | 7/2003 | ............ H01L 33/10 |
| TW | I223901 | 11/2004 | |
| TW | I495152 | 8/2015 | |

* cited by examiner

*Primary Examiner* — Jose R Diaz
(74) *Attorney, Agent, or Firm* — WPAT PC

(57) ABSTRACT

A micro light emitting diode structure includes a light emitting stacking layer, an insulating layer, a first electrode and a second electrode. The light emitting stacking layer includes a truncated quadrangular pyramid, wherein the truncated quadrangular pyramid includes a first sidewall, a second sidewall, a third sidewall and a fourth sidewall, and a top portion of the truncated quadrangular pyramid has a recess. The insulating layer covers the first sidewall, the third sidewall and a part of the top portion of the light emitting stacking layer. The first electrode covers the first sidewall of the light emitting stacking layer, a part of the insulating layer on the top portion, and the bottom surface of the recess. The second electrode covers the third sidewall of the light emitting stacking layer, and another part of the insulating layer on the top portion and contacts the light emitting stacking layer through an opening of the insulating layer.

20 Claims, 11 Drawing Sheets

MICRO LIGHT EMITTING DIODE STRUCTURE, PIXEL UNIT, AND LIGHT EMITTING DIODE DISPLAY PANEL

BACKGROUND

Technical Field

The present invention relates to a micro light emitting diode (LED) structure, and in particular, to a micro light emitting diode structure that can achieve a high-resolution frame and improve brightness, and a pixel unit and an light emitting diode display panel that include the aforementioned micro light emitting diode structure.

Related Art

Light emitting diode display (LED display) has features that a color filter is not required, a backlight module is not required, and the like, and has advantages of low power consumption, high contrast, high response speed, and the like, and therefore has been regarded as a substituent of liquid crystal display (LCD) to become a mainstream of a next generation of display technologies. Moreover, in recent years, light emitting diode display technologies become increasingly mature, and are applicable to products such as smart phone, television (TV), and computer monitor. Therefore, the industry is increasingly committed to the development of micro light emitting diode display, so as to enable the light emitting diode display to have higher resolution.

Lateral light emitted by a traditional micro light emitting diode travels along a horizontal direction, and therefore is incapable of arriving at a visual angle area of a user at a top side of the traditional micro light emitting diode. In order to improve light utilization and increase brightness of the visual angle area, it is known that a light shielding structure is disposed at an outer periphery/outer peripheries of a single micro light emitting diode/a plurality of micro light emitting diodes of an light emitting diode display, and a surface of the light shielding structure is coated with a reflective layer, so as to form a reflective surface to reflect light, thereby enabling most light of the micro light emitting diode/micro light emitting diodes to be reflected to a visual angle range of a user, and further improving the brightness. However, the arrangement of the light shielding structure causes that the micro light emitting diode/micro light emitting diodes cannot be closely arranged and placing space is limited, which further limits the possibility of improving frame resolution. On the other hand, a reflective surface has the best effect as long as the reflective surface surrounds a micro light emitting diode, but this structure adds complexity to a manufacturing process and is unfavorable to production. however, if a plurality of micro light emitting diodes shares a same reflective surface, a micro light emitting diode may be excessively far away from a particular reflective surface, leading to a poor reflection effect. Besides, in practical manufacturing processes and products, a reflective surface of a shielding structure can hardly be manufactured as an inclined plane with a flat surface, but is formed as an arched surface, thereby failing to effectively converge light. Therefore, light that is guided to a visual angle range of a user is limited. It can be known from the above that the industry still needs to continue studying how to improve overall brightness and resolution of an light emitting diode display.

SUMMARY

One objective of an embodiment of the present invention is to provide a micro light emitting diode structure, which improves brightness and further improves frame resolution by means of configuration of light emitting surfaces and reflective surfaces between micro light emitting diode structures, and to apply the micro light emitting diode structure to a pixel unit and a display panel.

An embodiment of the present invention provides a micro light emitting diode structure, including: a light emitting stacking layer, an insulating layer, a first electrode and a second electrode. The light emitting stacking layer includes a truncated quadrangular pyramid and is disposed on a substrate. The truncated quadrangular pyramid includes a first sidewall, a second sidewall, a third sidewall and a fourth sidewall. The first sidewall is adjacent to the second sidewall and the fourth sidewall. The third sidewall is adjacent to the second sidewall and the fourth sidewall and is opposite to the first sidewall. A top portion of the truncated quadrangular pyramid has a recess. In addition, the first sidewall, the second sidewall, the third sidewall and the fourth sidewall of the light emitting stacking layer are connected to each other on a surface of the substrate, so as to form a quadrilateral, and the first sidewall, the second sidewall, the third sidewall and the fourth sidewall respectively have a first angle, a second angle, a third angle and a fourth angle, which are less than 90°, with the surface of the substrate. The insulating layer covers the first sidewall, the third sidewall and a part of the top portion of the light emitting stacking layer, and does not cover a bottom surface of the recess. In addition, the insulating layer has an opening, disposed adjacent to the third sidewall, at the top portion of the light emitting stacking layer, and therefore does not cover a part of the light emitting stacking layer. The first electrode covers the first sidewall of the light emitting stacking layer, a part of the insulating layer on the top portion, and the bottom surface of the recess. The second electrode covers the third sidewall of the light emitting stacking layer, and another part of the insulating layer on the top portion, and contacts the light emitting stacking layer through the opening.

Another embodiment of the present invention provides a light emitting diode display panel, including a first sub-pixel and a second sub-pixel. The first sub-pixel includes two first light emitting diode elements, wherein each of the first light emitting diode elements includes one micro light emitting diode structure described above, and the first light emitting diode elements are configured to generate first chromatic light. The second sub-pixel includes two second light emitting diode elements, wherein each of the second light emitting diode elements includes one micro light emitting diode structure described above, and the second light emitting diode elements are configured to generate second chromatic light, where the second chromatic light is different from the first chromatic light. The second sub-pixel and the first sub-pixel are arranged side by side. The first sidewall or the third sidewall of any of the micro light emitting diode structures in the first sub-pixel and the second sub-pixel faces the second sidewall or the fourth sidewall of another adjacent micro light emitting diode structure.

Still another embodiment of the present invention provides a pixel unit, including a plurality of micro light emitting diode structures described above. The plurality of micro light emitting diode structures are arranged side by side on a substrate. The second sidewall and the fourth sidewall of each micro light emitting diode structure are respectively light emitting surfaces of the micro light emitting diode structure. The first electrode covering the first sidewall and the second electrode covering the third sidewall are respectively reflective surfaces of the micro light emitting diode structure. Each of the light emitting surfaces of any one of the micro light emitting diode structures faces one of the reflective surfaces of an adjacent micro light emitting diode structure, such that light emitted through the light emitting surfaces can be reflected by the reflective surface.

DETAILED DESCRIPTION

In order to make the present invention more comprehensible to a person skilled in the art, features and effects of the present invention are described in detail below through preferred embodiments of the present invention with reference to the accompanying drawings.

Figure 1A:
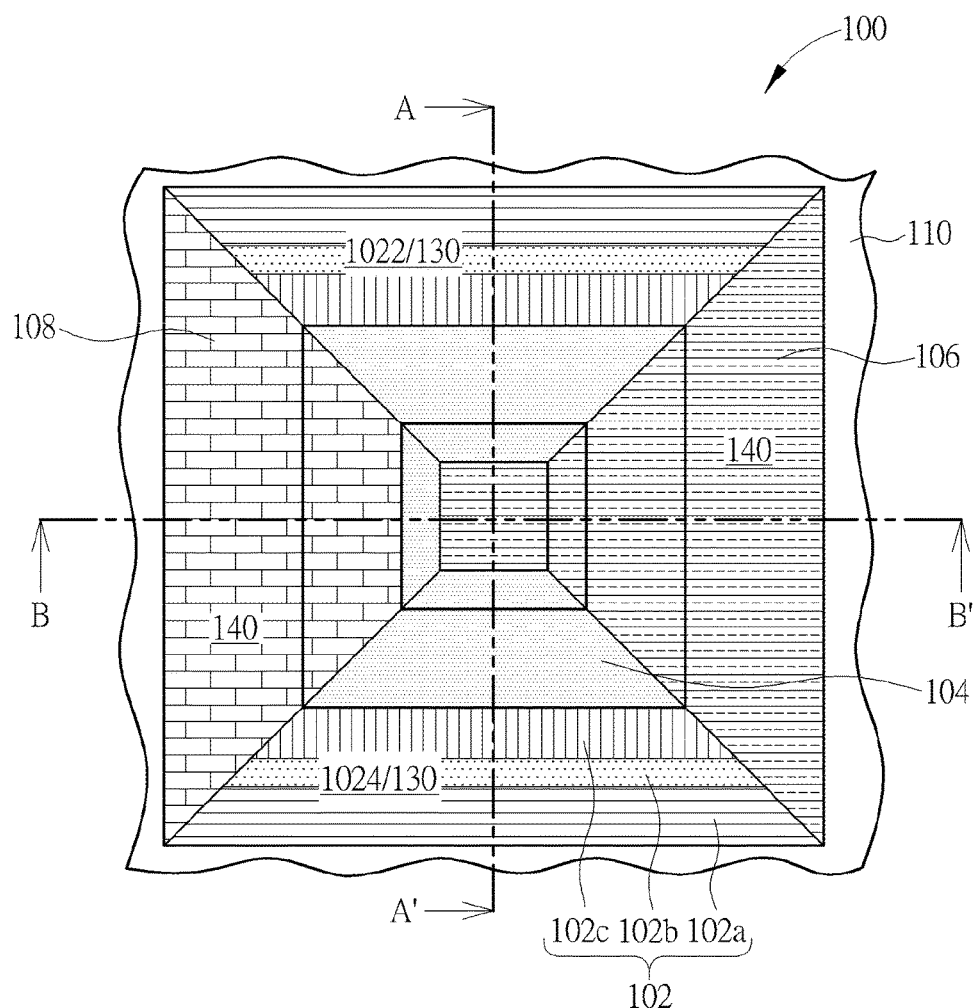
FIG. 1A shows a top view of an embodiment of a micro light emitting diode structure according to the present invention.
Figure 1B:
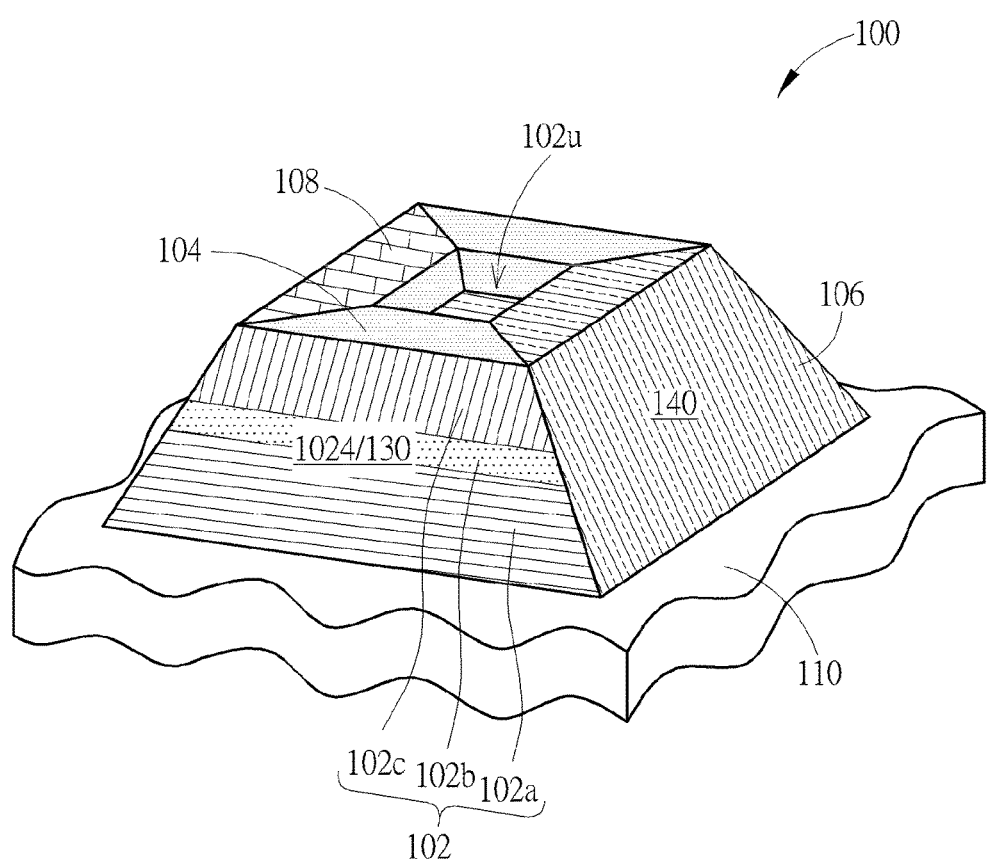
FIG. 1B shows a schematic diagram of an appearance of the embodiment of the micro light emitting diode structure according to the present invention.
Figure 2:
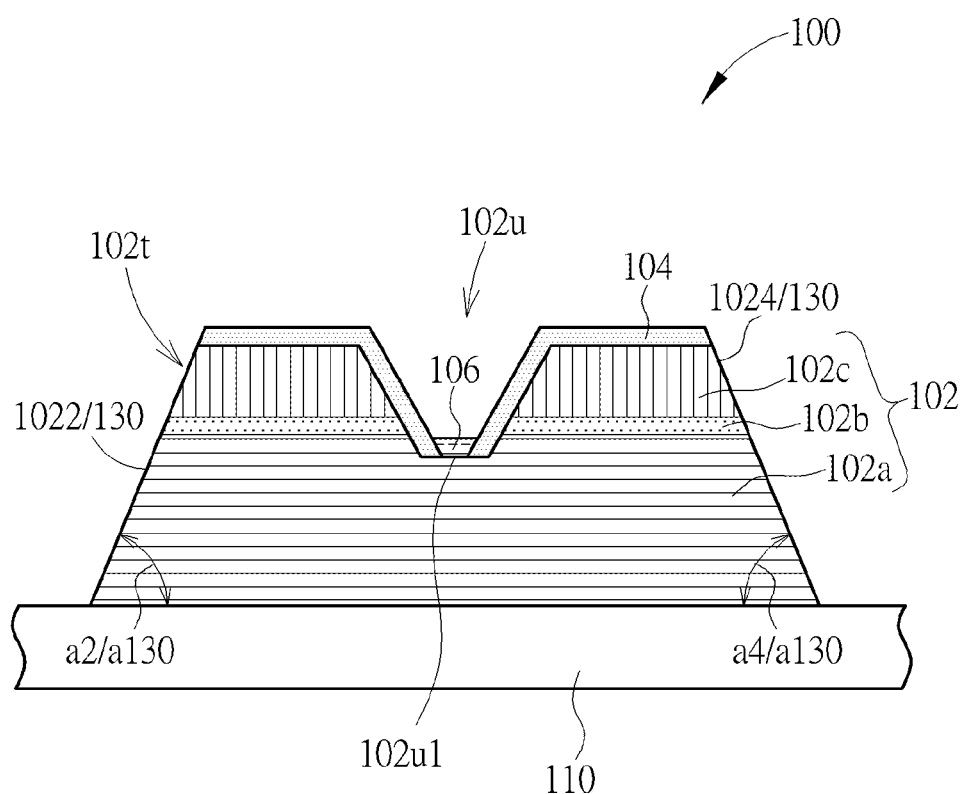
FIG. 2 shows a cross-sectional view of the micro light emitting diode structure according to the present invention taken along a cross-sectional line A-A' of FIG. 1A.
Figure 3:
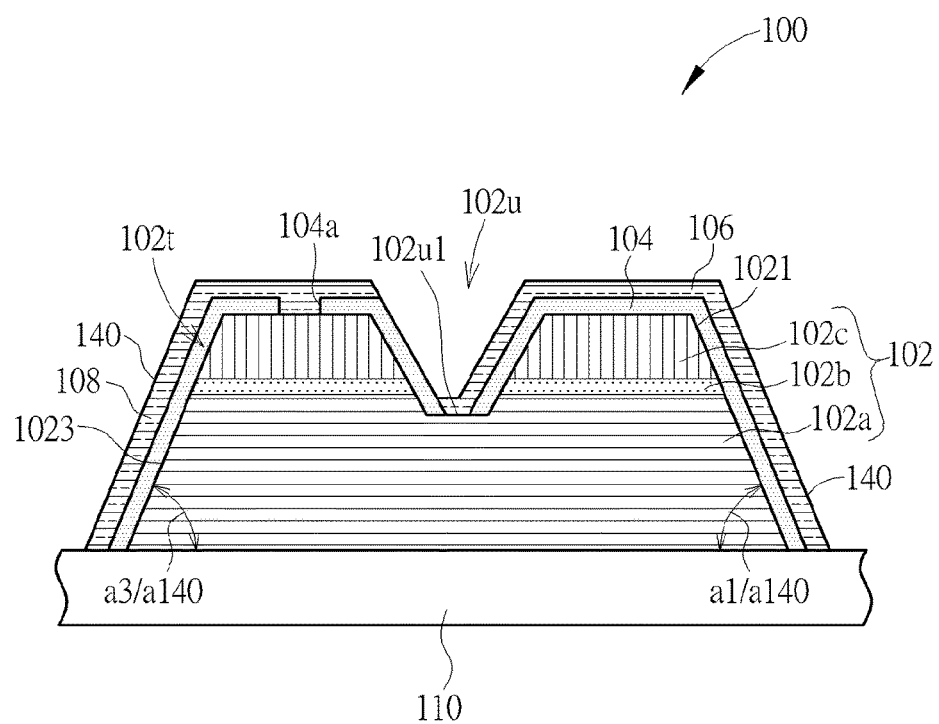
FIG. 3 shows a cross-sectional view of the micro light emitting diode structure according to the present invention taken along a cross-sectional line B-B' of FIG. 1A.
Figure 4:
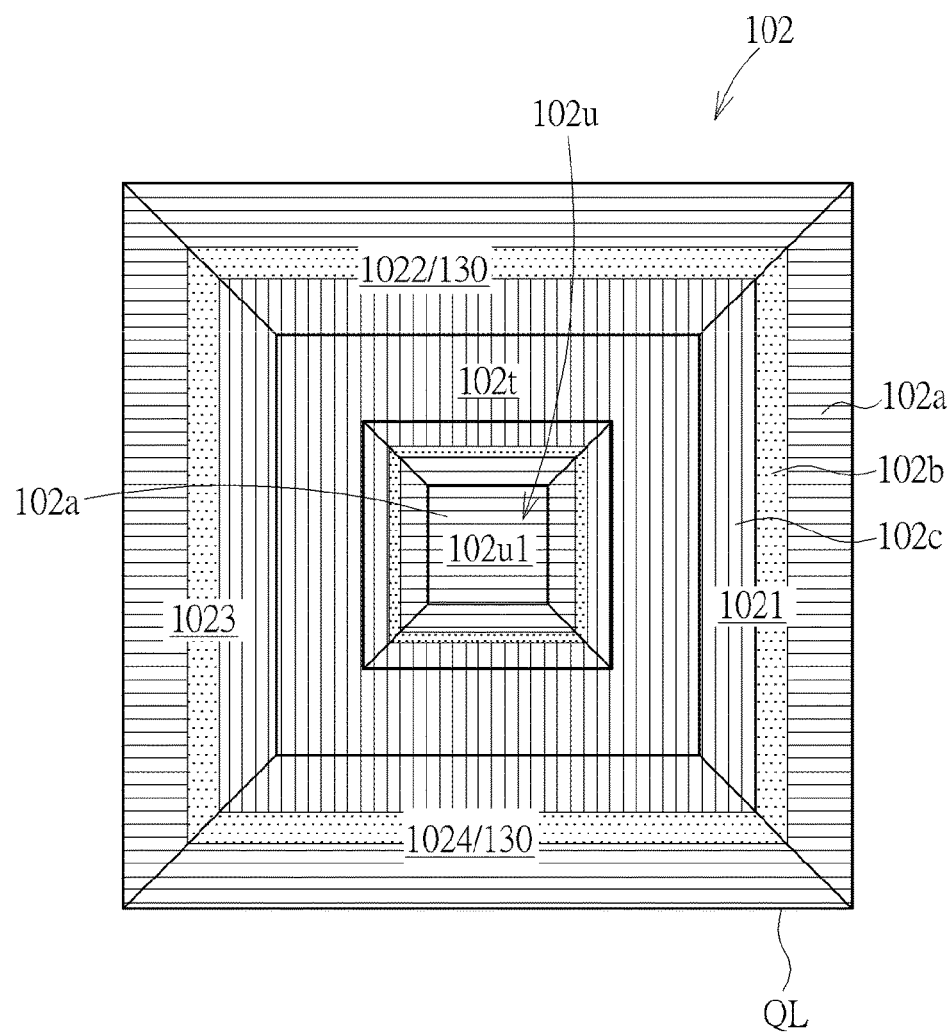
FIG. 4 shows a top view of a light emitting stacking layer of the micro light emitting diode structure shown in FIG. 1A.

Referring to FIG. 1A to FIG. 3, FIG. 1A shows a top view of an embodiment of a micro light emitting diode structure according to the present invention, FIG. 1B shows a schematic diagram of an appearance of the embodiment of the micro light emitting diode structure according to the present invention, FIG. 2 shows a cross-sectional view of the micro light emitting diode structure taken along a cross-sectional line A-A' of FIG. 1A, and FIG. 3 shows a cross-sectional view of the micro light emitting diode structure taken along a cross-sectional line B-B' of FIG. 1A. As shown in FIG. 1A to FIG. 3, a micro light emitting diode structure 100 of the present invention includes a light emitting stacking layer 102, an insulating layer 104, a first electrode 106 and a second electrode 108, and the following sequentially introduces structures of the foregoing elements and a relative arrangement relationship among the foregoing elements. The light emitting stacking layer 102 of the micro light emitting diode structure 100 is disposed on a substrate 110, where the light emitting stacking layer 102 includes a first type doped semiconductor layer 102a, an active layer 102b and a second type doped semiconductor layer 102c that are sequentially stacked on the substrate 110 from bottom up. Referring to FIG. 4 at the same time, FIG. 4 shows a top view of a light emitting stacking layer of the micro light emitting diode structure shown in FIG. 1A. As compared with FIG. 1A, FIG. 4 only shows a structure of the light emitting stacking layer 102, that is, FIG. 4 only shows the first type doped semiconductor layer 102a, the active layer 102b and the second type doped semiconductor layer 102c. The light emitting stacking layer 102 of the present invention includes a truncated quadrangular pyramid. Accurately, the light emitting stacking layer 102 includes an analogous truncated quadrangular pyramid between a quadrangular prism and a square pyramid. The light emitting stacking layer 102 includes a first sidewall 1021, a second sidewall 1022, a third sidewall 1023 and a fourth sidewall 1024, where the first sidewall 1021 is adjacent to the second sidewall 1022 and the fourth sidewall 1024, and the third sidewall 1023 is adjacent to the second sidewall 1022 and the fourth sidewall 1024 and is opposite to the first sidewall 1021. In this embodiment, the first sidewall 1021, the second sidewall 1022, the third sidewall 1023 and the fourth sidewall 1024 are of trapezoid shapes. Besides, the first sidewall 1021, the second sidewall 1022, the third sidewall 1023 and the fourth sidewall 1024 of the light emitting stacking layer 102 respectively have a first angle a1, a second angle a2, a third angle a3 and a fourth angle a4 with a surface of the substrate 110, where the first angle a1, the second angle a2, the third angle a3 and the fourth angle a4 are all less than 90°. In other words, the first angle a1, the second angle a2, the third angle a3 and the fourth angle a4 are acute angles. Therefore, when the first sidewall 1021, the second sidewall 1022, the third sidewall 1023 and the fourth sidewall 1024 are disposed on the substrate 110, the first sidewall 1021, the second sidewall 1022, the third sidewall 1023 and the fourth sidewall 1024 incline towards opposite sidewalls. As shown in FIG. 4, a projected area of the first type doped semiconductor layer 102a on the substrate 110 is greater than a projected area of the active layer 102b on the substrate 110, and the projected area of the active layer 102b on the substrate 110 is greater than a projected area of the second type doped semiconductor layer 102c on the substrate 110. In other words, a sectional area, parallel to the surface of the substrate 110, of the light emitting stacking layer 102 tapers from the substrate 110. In the embodiment, a projected area is defined as a vertical projection area in a direction perpendicular to the surface of the substrate 110. Moreover, the light emitting stacking layer 102 has a top surface that is parallel to the surface of substrate 110 and is connected to top portions of the first sidewall 1021, the second sidewall 1022, the third sidewall 1023 and the fourth sidewall 1024, and therefore, the light emitting stacking layer 102 comprises a truncated quadrangular pyramid. However, in this prescription, a truncated quadrangular pyramid is used to describe an appearance of the light emitting stacking layer 102. On the other hand, according to this embodiment, bottom portions of the first sidewall 1021, the second sidewall 1022, the third sidewall 1023 and the fourth sidewall 1024 of the light emitting stacking layer 102 are connected to each other on the surface of the substrate 110, so as to form a quadrilateral, as shown in a quadrilateral QL in FIG. 4, where each of the first sidewall 1021, the second sidewall 1022, the third sidewall 1023 and the fourth sidewall 1024 respectively corresponds to one side of the quadrilateral QL. In a preferred embodiment, bottom sides of the first sidewall 1021, the second sidewall 1022, the third sidewall 1023 and the fourth sidewall 1024 are equal, and therefore, the bottom portions of the first sidewall 1021, the second sidewall 1022, the third sidewall 1023 and the fourth sidewall 1024 are connected to each other on the surface of the substrate 110, so as to form a square. In other words, a vertical projection of the light emitting stacking layer 102 on the substrate 110 is a square. However, the present invention is not limited thereto. Bottom sides of the first sidewall 1021, the second sidewall 1022, the third sidewall 1023 and the fourth sidewall 1024 may not be completely equal, and a vertical projection of the light emitting stacking layer 102 on the substrate 110 may not be a square. A vertical projection of the light emitting stacking layer 102 on the substrate 110, for example, may be a rectangle with sides being not completely equal, or a parallelogram. Further, a top portion 102t of the truncated quadrangular pyramid has a recess 102u, and the first type doped semiconductor layer 102a is exposed at a bottom portion of the recess 102u. In this embodiment, the recess 102u is approximately located at the center of the top portion 102t of the truncated quadrangular pyramid, but the present invention is not limited thereto.

According to an embodiment of the present invention, the first type doped semiconductor layer 102a has a first doped conductivity type, and the second type doped semiconductor layer 102c has a second doped conductivity type, where the first doped conductivity type is different from the second doped conductivity type. For example, in this embodiment, the first doped conductivity type is n-type, and the second doped conductivity type is p-type, but the present invention is not limited thereto. In another embodiment, the conductivity type of the first doped conductivity type and the second doped conductivity type may be opposite. A material of the light emitting stacking layer 102 of this embodiment may include aluminum gallium arsenide (AlGaAs), gallium arsenide phosphide (GaAsP), aluminum gallium indium phosphide (AlGaInP), gallium phosphide (GaP), indium gallium nitride (InGaN), gallium nitride (GaN), gallium phosphide (GaP), aluminum gallium indium phosphide (AlGaInP), gallium aluminum phosphide (AlGaP), zinc selenide (ZnSe), or the like, but the present invention is not limited thereto. For example, a material of the first type doped semiconductor layer 102a may include n-type GaN or n-type GaAs, and a material of the second type doped semiconductor layer 102c may include p-type GaN or p-type GaAs, or a material of the first type doped semiconductor layer 102a may include p-type GaN or p-type GaAs, and a material of the second type doped semiconductor layer 102c may include n-type GaN or n-type GaAs. For example, a material of the active layer 102b may include InGaN and AlGaAs.

The color of light of the light emitting stacking layer 102 can be determined by a semiconductor material of the active layer. For example, when the micro light emitting diode structure 100 is designed as a micro light emitting diode that emits red light, green light, or blue light, the active layer 102b may have different materials. In one embodiment, the material of the first type doped semiconductor layer 102a is n-type GaN, the material of the second type doped semiconductor layer 102c is p-type GaN, the material of the active layer 102b is InGaN, and the micro light emitting diode structure 100 can emit blue light.

The insulating layer 104 of the micro light emitting diode structure 100 is disposed at an outer side of the light emitting stacking layer 102 to cover the first sidewall 1021, the third sidewall 1023, a part of the top portion 102t, and sidewalls of the recess 102u. However, the second sidewall 1022, the fourth sidewall 1024, the remaining part of the top portion 102t, and a bottom portion of the recess 102u of the light emitting stacking layer 102 are not covered by the insulating layer 104, and therefore, the first type doped semiconductor layer 102a is exposed at the bottom portion of the recess 102u. As shown in FIG. 3, the insulating layer 104 has an opening 104a at the top portion 102t of the light emitting stacking layer 102, the opening 104a does not cover a part of the light emitting stacking layer 102, that is, the opening 104a exposes the partial light emitting stacking layer 102. In this embodiment, the opening 104a of the insulating layer 104 does not cover a part of the second type doped semiconductor layer 102c, that is, the opening 104a exposes the partial second type doped semiconductor layer 102c. In this embodiment, the insulating layer 104 may be transparent or translucent, so as to reduce impact of light transmittance and improve brightness, for example, a material of the insulating layer 104 may be silicon dioxide (SiO2) or silicon nitride (SiNx), but the present invention is not limited thereto.

The first electrode 106 covers the first sidewall 1021 of the light emitting stacking layer 102 and a part of the insulating layer 104 on the top portion 102t, that is, the first electrode 106 covers the insulating layer 104 disposed on the first sidewall 1021. In addition, the first electrode 106 further covers a bottom surface 102u1 of the recess 102u. The bottom surface 102u1 of the recess 102u is not covered by the insulating layer 104, and therefore, the first electrode 106 directly contacts the exposed first type doped semiconductor layer 102a through the bottom portion of the recess 102u. In other words, the first electrode 106 and the first type doped semiconductor layer 102a are electrically connected at the bottom portion of the recess 102u. On the other hand, the second electrode 108 covers the third sidewall 1023 of the light emitting stacking layer 102 and a part of the insulating layer 104 on the top portion 102t, that is, the second electrode 108 covers the insulating layer 104 disposed on the third sidewall 102. Therefore, the second electrode 108 and the first electrode 106 are located at opposite sides of the micro light emitting diode structure 100, that is, the first electrode 106 and the second electrode 108 are oppositely disposed and are not structurally connected. In addition, the second electrode 108 contacts the second type doped semiconductor layer 102c of the light emitting stacking layer 102 through the opening 104a of the insulating layer 104. In other words, the second electrode 108 and the second type doped semiconductor layer 102c are electrically connected through the opening 104a of the insulating layer 104. In this embodiment, the doped conductivity type of the first type doped semiconductor layer 102a is n-type, and the doped conductivity type of the second type doped semiconductor layer 102c is p-type. Therefore, the first electrode 106 is used as a cathode electrode of the micro light emitting diode structure 100, and the second electrode 108 is an anode electrode. In a variant embodiment, the first type doped semiconductor layer 102a may use p-type as the first doped conductivity type, and the second type doped semiconductor layer 102c uses n-type as the second doped conductivity type. Therefore, the first electrode 106 is an anode electrode, and the second electrode 108 is a cathode electrode. According to the present invention, materials of the first electrode 106 and the second electrode 108 are reflective metallic materials, such as copper, silver, or other appropriate reflective metallic materials. Therefore, the first electrode 106 and the second electrode 108 are used as reflective surfaces 140 of the micro light emitting diode structure 100, so as to reflect light towards a direction opposite to the substrate 110, that is, reflect right towards upper sides in FIG. 2 and FIG. 3, thereby improving brightness of the light transmitted upwards.

It should be noted that the first electrode 106 and the second electrode 108 do not cover the second sidewall 1022 and the fourth sidewall 1024 of the light emitting stacking layer 102, and therefore, a surface of the second sidewall 1022 and a surface of the fourth sidewall 1024 do not have the reflective surfaces 140, and the active layer 102b of the light emitting stacking layer 102 is exposed on the surface of the second sidewall 1022 and the surface of the fourth sidewall 1024, such that the second sidewall 1022 and the fourth sidewall 1024 respectively form light emitting surfaces 130 of the micro light emitting diode structure 100, and the two light emitting surfaces 130 are oppositely disposed at two sides of the micro light emitting diode structure 100. It can be known that the surfaces of the four sidewalls of the micro light emitting diode structure 100 have two light emitting surfaces 130 and two reflective surfaces 140, both of the two light emitting surfaces 130 and the two reflective surfaces 140 are oppositely disposed, and any one light emitting surface 130 is disposed adjacent to the two reflective surface 140. Further, the second sidewall 1022 and the fourth sidewall 1024 are used as the light emitting surfaces 130 of the micro light emitting diode structure 100, and therefore, the second angle a2 and the fourth angle a4 are defined as light emitting surface angles a130 of the light emitting diode structure 100. On the other hand, the first electrode 106 and the second electrode 108 covering the first sidewall 1021 and the third sidewall 1023 are defined as the reflective surfaces 140, and therefore, the first angle a1 and the third angle a3 are defined as reflective surface angles a140.

Figure 5:
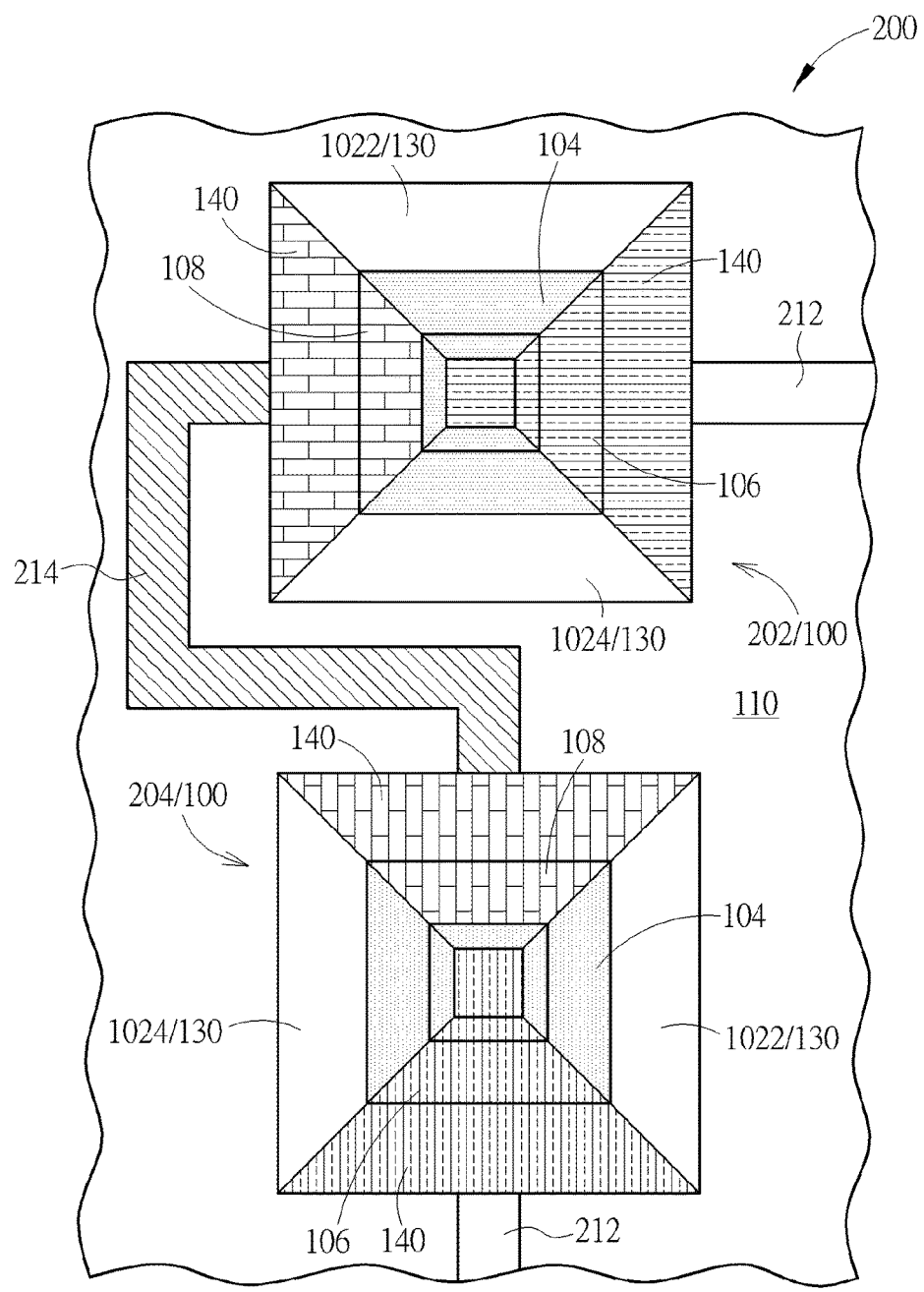
FIG. 5 shows a top view of an embodiment of a pixel unit according to the present invention.

Referring to FIG. 5, FIG. 5 shows a top view of an embodiment of a pixel unit according to the present invention. As shown in FIG. 5, the pixel unit 200 of the present invention includes a plurality of micro light emitting diode structures 100 as shown in FIG. 1A to FIG. 3 and is applied to an light emitting diode display panel, and the direction of the micro light emitting diode structure 100 opposite to the direction of the substrate 110 is a display surface of the light emitting diode display panel, that is, a user views a display frame from the side of the top portion of the micro light emitting diode structure 100. In a preferred embodiment, the pixel unit 200 of the present invention includes an even number of micro light emitting diode structures 100. In this embodiment, the pixel unit 200 including two micro light emitting diode structures 202, 204 is used as an example, but the present invention is not limited thereto. Therefore, each of the micro light emitting diode structures 100 in the pixel unit 200 has two light emitting surfaces 130 and two reflective surfaces 140. According to an embodiment of the present invention, in order to enable light emitted by the light emitting surfaces 130 can be reflected, by the reflective surfaces 140, towards the display surface, any light emitting surface 130 of the micro light emitting diode structures 100 of the pixel unit 200 faces one reflective surface 140 of an adjacent micro light emitting diode structure 100, such that light emitted by the light emitting surface 130 can be reflected upwards by the reflective surface 140 of the adjacent micro light emitting diode structure 100. In other words, a travel direction of the light emitted by the light emitting surface 130 after the light is reflected by the reflective surface 140 includes that the light is transmitted towards a direction reverse to the direction of the substrate 110, so as to enable the light to enter a visual angle range of a user, and to improve brightness of the display surface. It can be known that a quantity of the micro light emitting diode structures 100 included in the pixel unit 200 is an even number, and therefore, a quantity of light emitting surfaces 130 and a quantity of reflective surfaces 140 of FIG. 5 are all equal, so as to uniform the amount of light towards the upper side, the lower side, the left side, and the right side of the overall pixel unit 200, and further to uniform distribution of light reflected towards the display surface.

Besides, in a preferred embodiment, a first sidewall 1021 of any micro light emitting diode structure 100 of the pixel unit 200 faces a second sidewall 1022 of another side by side (i.e. adjacent and parallel) micro light emitting diode structure 100, and a third sidewall 1023 of each micro light emitting diode structure 100 faces a forth sidewall 1024 of another side by side micro light emitting diode structure 100. That is, each micro light emitting diode structure 100 is configured to be 90° rotated with respect to an adjacent micro light emitting diode structure 100. In a preferred embodiment, the second electrodes 108 of the micro light emitting diode structures 100 of the pixel unit 200 are electrically connected to each other, in other words, the second electrodes 108 of the micro light emitting diode structures 100 in a same pixel unit 200 are equipotential, and the second type doped semiconductor layers 102c electrically connected to the second electrodes 108 are equipotentially driven. As shown in FIG. 5, the pixel unit 200 may include a plurality of first wires 212, each of which is electrically connected to one first electrode 106, such that the first electrodes 106 are electrically connected to a voltage source, for example, electrically connected to a common voltage source so as to supply a constant voltage to the micro light emitting diode structures 100. On the other hand, the pixel unit 200 may further includes second wires 214, used to electrically connect the second electrodes 108 of the micro light emitting diode structures 100 in the same pixel unit 200. The first wires 212 and the second wires 214 may be disposed on the surface of the substrate 110, or be embedded in the substrate 110. By means of the foregoing design, when an light emitting diode display panel includes a plurality of parallel pixel units 200, complexity of wiring between the pixel units 200 may be simplified, and design in which each light emitting surfaces 130 faces a reflective surface 140 is achieved synchronously.

As described previously, each light emitting surface 130 of the micro light emitting diode structures 100 in the pixel unit 200 faces a reflective surface 140, so as to avoid the problem that a plurality of micro light emitting diode elements share a reflective surface of a light shielding structure in the prior art, to avoid a scenario in which a light emitting surface 130 is excessively far away from a reflective surface 140, and to effectively improve a light emergent effect. Further, each micro light emitting diode structure 100 in a same pixel unit 200 provides a reflective surface for another adjacent micro light emitting diode structure 100, and therefore, additional arrangement of a light shielding structure between micro light emitting diode structures 100 to reflect light is not needed, so as to reduce a distance between adjacent micro light emitting diode structures 100 in the pixel unit 200, and further to simplify a manufacturing process and improve frame resolution.

Figure 6:
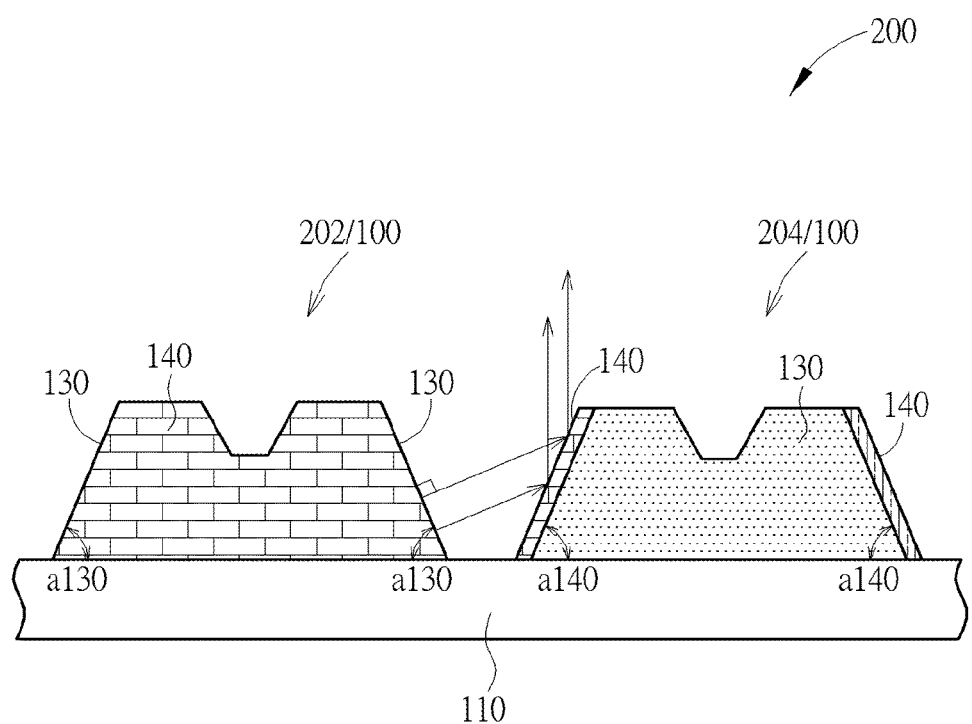
FIG. 6 is a side view of the pixel unit according to the present invention shown in FIG. 5.

Referring to FIG. 6, FIG. 6 shows a side view of the pixel unit according to an embodiment of the present invention shown in FIG. 5, and FIG. 6 further shows a schematic diagram of travel of light of the pixel unit. As shown in FIG. 6, in this embodiment, the light emitting surface angles a130 are equal to the reflective surface angles a140. In other words, the second angle a2 of the second sidewall 1022 and the fourth angle a4 of the fourth sidewall 1024 of the micro light emitting diode structure 100 are equal to the first angle a1 of the first sidewall 1021 and the third angle a3 of the third sidewall 1023. When light is generated by the active layer 102b and is emitted by the light emitting surface 130, most light directly travels to the reflective surface 140. Because the reflective surface angle a140 is an acute angle, the reflective surface 140 can reflect the light towards a direction opposite to the substrate 110, that is, the light is transmitted towards the display surface. The present invention does not limit a relationship between the reflective surface angles a140 and the light emitting surface angles a130, that is, does not limit that the light emitting surface angles a130 shall be equal to the reflective surface angles a140. The reflective surface 140 and the light emitting surface 130 may respectively have different inclinations according to requirements, so as to improve the amount of light reflected towards the display surface and the brightness of the overall pixel unit 200. It should be noted that, light vertical to the light emitting surfaces 130 has strongest brightness, and light is mainly emitted from the active layer 102b, and therefore, when the light emitting surface angles a130 and the reflective surface angles a140 are designed, the relationship between the light emitting surface angles a130 and the reflective surface angles a140 may be adjusted by taking the following factors into consideration, a position of the active layer 102b, a travel path of the light emitted from the active layer 102b and vertical to the light emitting surfaces 130, and a distance between the micro light emitting diode structure 100 and an adjacent micro light emitting diode structure 100, so as to improve light utilization.

Figure 7:
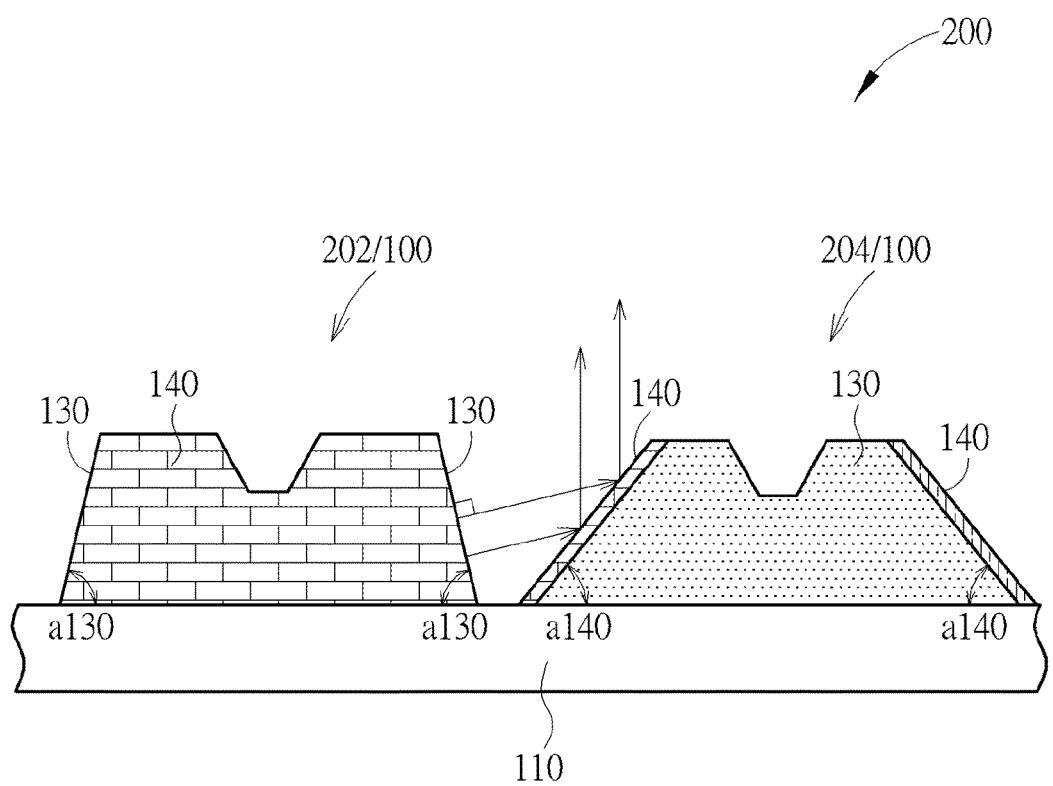
FIG. 7 shows a side view of a micro light emitting diode of a first variant embodiment of the pixel unit according to the present invention.
Figure 8:
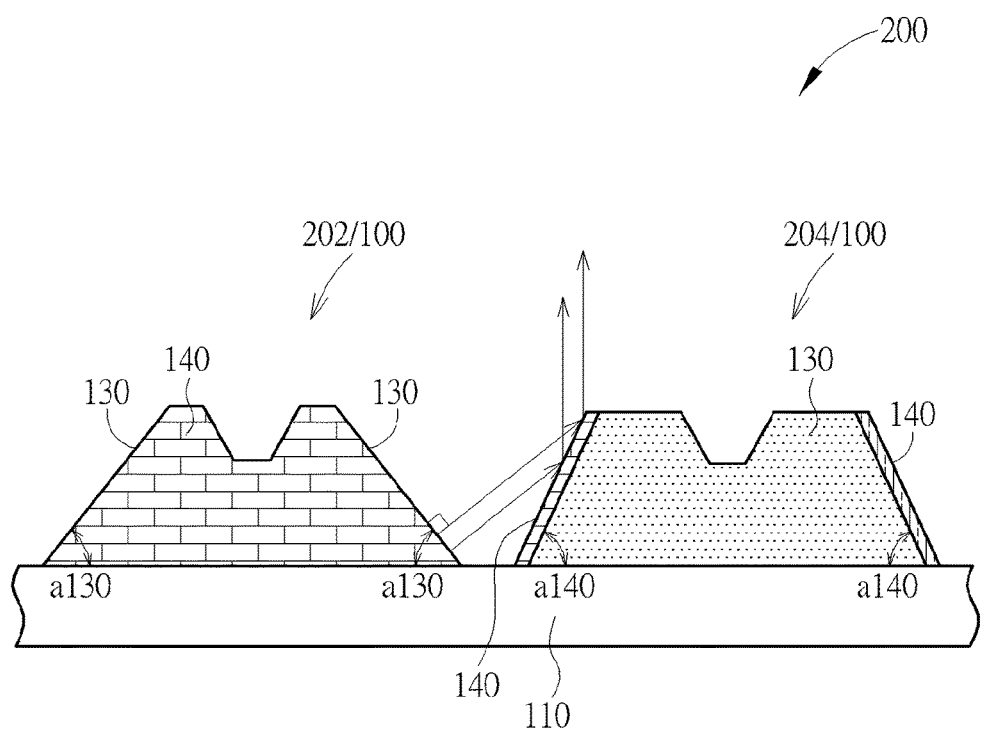
FIG. 8 shows a side view of a micro light emitting diode of a second variant embodiment of the pixel unit according to the present invention.

Referring to FIG. 7 and FIG. 8, FIG. 7 shows a side view of a micro light emitting diode of a first variant embodiment of the pixel unit according to the present invention, and FIG. 8 shows a side view of a second variant embodiment of the pixel unit according to the present invention. As shown in FIG. 7, in the first variant embodiment, the light emitting surface angles a130 are greater than the reflective surface angles a140. In other words, the second angle a2 of the second sidewall 1022 and the fourth angle a4 of the fourth sidewall 1024 of the micro light emitting diode structure 100 are greater than the first angle a1 of the first sidewall 1021 and the third angle a3 of the third sidewall 1023. As shown in FIG. 8, in the second variant embodiment, the light emitting surface angles a130 are less than the reflective surface angles a140. In other words, the second angle a2 of the second sidewall 1022 and the fourth angle a4 of the fourth sidewall 1024 of the micro light emitting diode structure 100 are less than the first angle a1 of the first sidewall 1021 and the third angle a3 of the third sidewall 1023. It should be noted that, in the embodiments of the present invention shown in FIG. 5 and FIG. 6 and the first variant embodiment and the second variant embodiment of the present invention shown in FIG. 7 and FIG. 8, the first angle a1 and the third angle a3 in the reflective surface angles a140 are equal, and the second angle a2 and the fourth angle a4 in the light emitting surface angles a130 are equal. In other words, the light emitting surface angles a130 in a same micro light emitting diode structure 100 are equal, and the reflective surface angles a140 in a same micro light emitting diode structure 100 are equal. However, in another variant embodiment, the first angle a1 and the third angle a3 in the reflective surface angles a140 may be different, and the second angle a2 and the fourth angle a4 in the light emitting surface angles a130 may be different. As stated previously, the angles may be adjusted and designed according to requirements.

Figure 9:
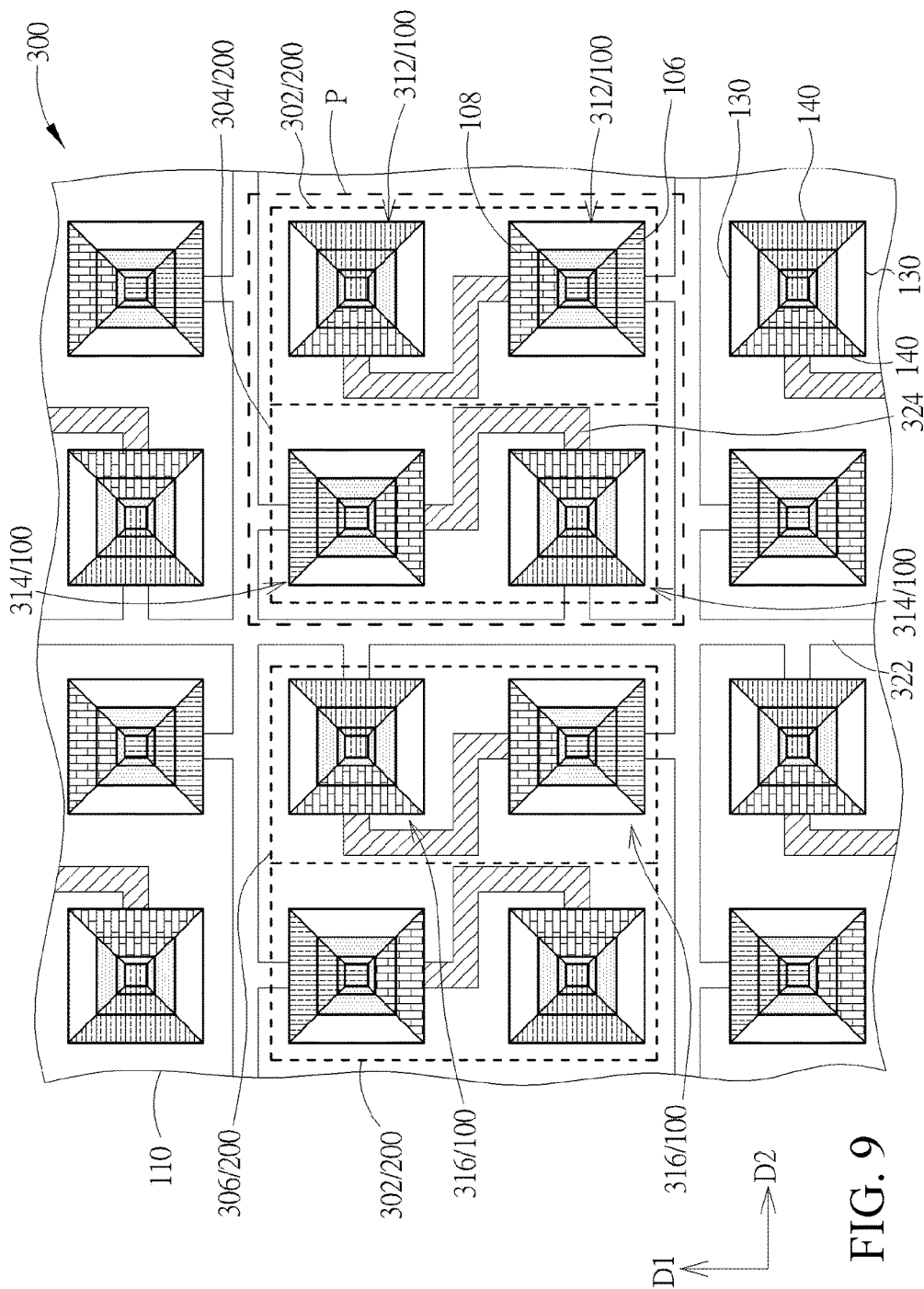
FIG. 9 shows a top view of an embodiment of an light emitting diode display panel according to the present invention.

Referring to FIG. 9, FIG. 9 shows a top view of an embodiment of a light emitting diode display panel according to the present invention. As shown in FIG. 9, a light emitting diode display panel 300 of this embodiment includes a first sub-pixel 302 and a second sub-pixel 304. The first sub-pixel 302 includes the pixel unit 200 shown in FIG. 5 and includes two first light emitting diode elements 312. Each of the first light emitting diode elements 312 includes one micro light emitting diode structure 100 shown in FIG. 1A to FIG. 3, and the first light emitting diode elements 312 are configured to generate first chromatic light. The second sub-pixel 304 includes the pixel unit 200 shown in FIG. 5 and includes two second light emitting diode elements 314. Each of the second light emitting diode elements 314 includes one micro light emitting diode structure 100 shown in FIG. 1A to FIG. 3, and the second light emitting diode elements 314 are configured to generate second chromatic light. The second chromatic light is different from the first chromatic light. Optionally, the light emitting diode display panel 300 of this embodiment may further includes a third sub-pixel 306. The third sub-pixel 306 includes the pixel unit 200 shown in FIG. 5 and includes two third light emitting diode elements 316. Each of the third light emitting diode elements 316 includes one micro light emitting diode structure 100 shown in FIG. 1A to FIG. 3, and the third light emitting diode elements 316 are configured to generate third chromatic light. The third chromatic light is different from the first chromatic light and the second chromatic light, for example, the first chromatic light, the second chromatic light and the third chromatic light are respectively red light, blue light, and green light, but the present invention is not limited thereto. Therefore, active layers 102b of the micro light emitting diode structures 100 included in the first light emitting diode elements 312, the second light emitting diode elements 314 and the third light emitting diode elements 316 of this embodiment may have completely different materials, so as to emit different colors of light. In this embodiment, the two first light emitting diode elements 312 of the first sub-pixel 302, the two second light emitting diode elements 314 of the second sub-pixel 304 and the two third light emitting diode elements 316 of the third sub-pixel 306, are respectively arranged along a first direction D1, so as to enable the first sub-pixel 302, the second sub-pixel 304 and the third sub-pixel 306 to have long sides parallel to the first direction D1 and short sides parallel to a second direction D2. In this embodiment, the first direction D1 and the second direction D2 are substantially vertical to each other, but the present invention is not limited thereto. According to this embodiment, the first sub-pixel 302, the second sub-pixel 304 and the third sub-pixel 306 are arranged in an adjacent, alternate, and parallel manner, for example, the first sub-pixel 302, the second sub-pixel 304 and the third sub-pixel 306 are alternately arranged along the second direction D2, but the present invention is not limited thereto. Besides, the first side wall 1021 or the third sidewall 1023 of any micro light emitting diode structure 100 in the first sub-pixel 302, the second sub-pixel 304 and the third sub-pixel 306 faces the second sidewall 1022 or the fourth sidewall 1024 of another adjacent micro light emitting diode structure 10. In other words, a light emitting surface 130 of any micro light emitting diode structure 100 in any sub-pixel faces a reflective surface 140 of another adjacent micro light emitting diode structure 100.

In this embodiment, the light emitting diode display panel 300 may further includes at least one common electrode line 322 and a plurality of signal lines 324, where the common electrode line 322 is electrically connected to the first electrodes 106 of the micro light emitting diode structures 100 of the first sub-pixel 302, the second sub-pixel 304 and the third sub-pixel 306. The signal lines 324 are respectively electrically connected to at least one of the second electrodes 108 of the micro light emitting diode structures 100 of the first sub-pixel 302, the second sub-pixel 304 and the third sub-pixel 306. Therefore, in this embodiment, the common electrode line 322 is electrically connected to the first type doped semiconductor layers 102a of the micro light emitting diode structures 100, and the signal lines 324 are electrically connected to the second type doped semiconductor layer 102c of at least one micro light emitting diode structure 100, but the present invention is not limited thereto. For example, the light emitting diode display panel 300 may include a plurality of common electrode lines 322 that are respectively electrically connected to first doped semiconductor layers 102a of some micro light emitting diode structures 100. In addition, the signal lines 324 may further be respectively electrically connected to a thin film transistor (TFT), so as to individually drive each sub-pixel by using operation of the TFT. That is, a drive signal of the TFT is provided to each sub-pixel by using the signal lines 324, but the present invention is not limited thereto. In this embodiment, the signal lines 324 are electrically connected to two second electrodes 108 of two micro light emitting diode structures 100 in each sub-pixel, and therefore, the second wires 214 shown in FIG. 5 may be regarded as a part of the signal lines 324, and the first wires 212 shown in FIG. 5 may be regarded as a part of the common electrode lines 322, where the first wires 212 extend outwards from the sub-pixels, so as to be electrically connected to each other, but the present invention is not limited thereto.

The light emitting diode display panel 300 further has the at least one common electrode line 322 and the plurality of signal lines 324. Therefore, in this embodiment, the first sidewall 1021 of any micro light emitting diode structure 100 in the first sub-pixel 302, the second sub-pixel 304 and the third sub-pixel 306 is designed to face the second sidewall 1022 of another adjacent micro light emitting diode structure 100, and the third sidewall 1023 of any micro light emitting diode structure 100 is designed to face the fourth sidewall 1024 of another adjacent micro light emitting diode structure 100. In other words, each the micro light emitting diode structure 100 is configured to be ±90° rotated with respect to an adjacent micro light emitting diode structure 100. A configuration result is as shown in region P of FIG. 9. It should be noted that the degree of rotation of the micro light emitting diode structure 100 may be within the range of 80° to 100°. The region P is formed by two adjacent sub-pixels. With this configuration, the first electrodes 106 of the four micro light emitting diode structures 100 in the two adjacent sub-pixels face an outer side of the region P, and the second electrodes 108 face an inner side of the region P, so as to achieve the design that each light emitting surface 130 faces a reflective surface 140 and simplify the complexity of wiring of the common electrode line 322 and the signal lines 324.

It can be known from the above that, the light emitting diode display panel 300 in this embodiment of the present invention uses the pixel unit 200 shown in FIG. 5 as a sub-pixel, and the micro light emitting diode structures in each sub-pixel have particular configuration manners, and therefore, each light emitting surface 130 of each micro light emitting diode structure 100 faces a reflective surface 140 of another micro light emitting diode structure 100, such that additional arrangement of a light shielding structure between the micro light emitting diode structures 100 to reflect light is not needed, thereby reducing a distance between adjacent micro light emitting diode structures 100, and further simplifying a manufacturing process and improving frame resolution. Further, by using the aforementioned wiring principle of the common electrode line 322 and the signal lines 324, signals of the sub-pixels may be individually driven by means of simple wiring design.

Figure 10:
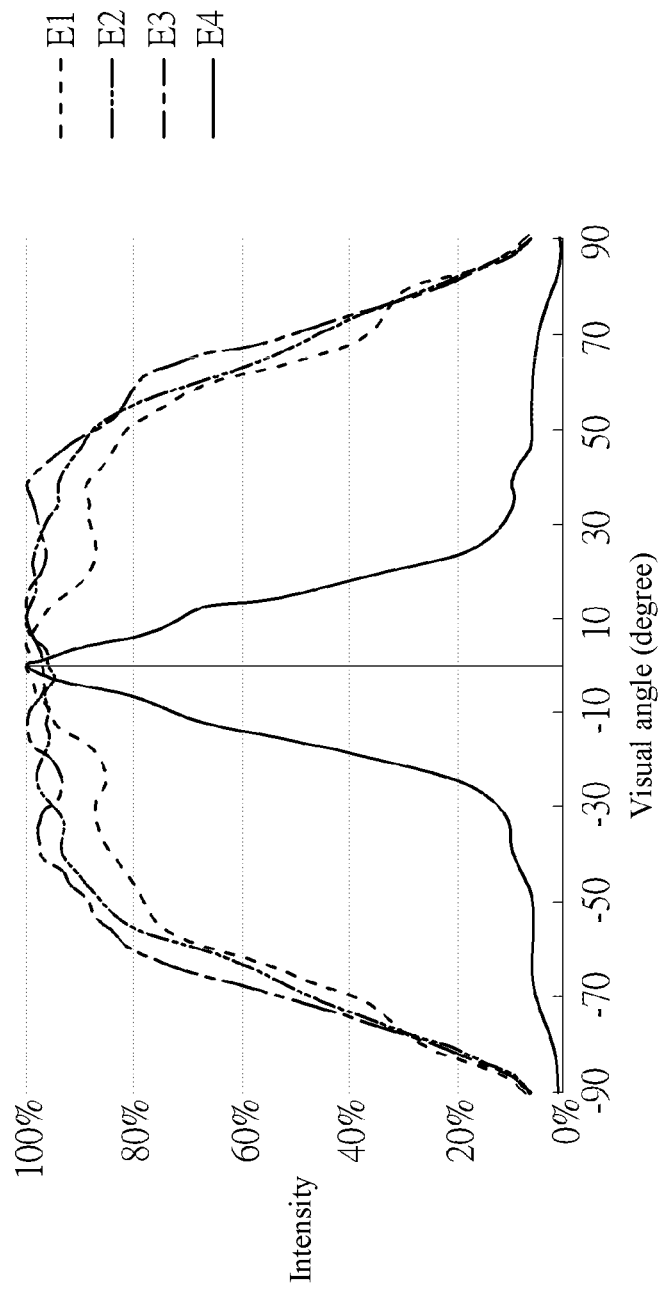
FIG. 10 shows a schematic diagram of Full-Width at Half-Maximum (FWHM) of the embodiments in table 1 when the pixel units are applied to the light emitting diode display panel.

Referring to table 1 and FIG. 10, Table 1 is a correspondence table of light emitting surface angles and reflective surface angles of embodiments of the pixel unit of the present invention, where light emitting surface angles a130 in a same micro light emitting diode structure 100 are equal, and reflective surface angles a140 in a same micro light emitting diode structure 100 are equal. FIG. 10 shows a schematic diagram of FWHM (Full-Width at Half-Maximum) of the embodiments in table 1 when the pixel units are applied to the light emitting diode display panel, which indicates light intensities of visual angle ranges of the light emitting diode display panel. As shown in table 1 and FIG. 10, in embodiment E1, light emitting surface angles a130 are 70°, and reflective surface angles a140 are between 50° and 60°, and therefore the light emitting surface angles a130 are greater than the reflective surface angles a140, and a travel path of light thereof may correspond to FIG. 7. In embodiment E2, light emitting surface angles a130 are 60°, and reflective surface angles a140 are between 55° and 65°, and therefore the light emitting surface angles a130 may be greater than, less than, or equal to the reflective surface angles a140, and a travel path of light thereof may correspond to FIG. 6 to FIG. 8. In embodiment E3, light emitting surface angles a130 are 50°, and reflective surface angles a140 are between 60° and 70°, and therefore the light emitting surface angles a130 are less than the reflective surface angles a140, and a travel path of light thereof may correspond to FIG. 8. In embodiment E4, light emitting surface angles a130 are 20°, and reflective surface angles a140 are between 75° and 85°, and therefore the light emitting surface angles a130 are less than the reflective surface angles a140, and a travel path of light thereof may correspond to FIG. 8. In FIG. 10, when a display panel includes micro light emitting diode structures with angle configurations represented by embodiment E1, embodiment E2, and embodiment E3, the display panel has relatively uniform distribution of light angles, that is, has a relatively good light intensity and relatively good light uniformness in a relatively large visual angle range. When a display panel includes micro light emitting diode structures with an angle configuration represented by embodiment E4, only a visual angle within ±10° on a display surface has a relatively good light intensity. Therefore, the angle configurations represented by embodiment E1, embodiment E2, and embodiment E3 are preferred embodiments of the present invention. In other words, when a range of the second angle a2 and the fourth angle a4 is between 50° and 70°, and a range of the first angle a1 and the third angle a3 is between 50° and 70°, relatively good and uniform light angle distribution is provided.

TABLE 1

Correspondence table of light emitting surface angles and reflective surface angles of embodiments of the pixel unit of the present invention

| Embodiment | Light emitting surface angle | Reflective surface angle |
| --- | --- | --- |
| E1 | 70° | 55° ± 5° |
| E2 | 60° | 60° ± 5° |

TABLE 1-continued

Correspondence table of light emitting surface
angles and reflective surface angles of embodiments
of the pixel unit of the present invention

| Embodiment | Light emitting surface angle | Reflective surface angle |
|---|---|---|
| E3 | 50° | 65° ± 5° |
| E4 | 20° | 80° ± 5° |

In view of the above, with the micro light emitting diode structure of the present invention and configuration and design of the micro light emitting diode structure in the pixel unit and the light emitting diode display panel, light emitted from a light emitting surface of the micro light emitting diode structure can be reflected by a reflective surface of an adjacent micro light emitting diode structure, such that light of an light emitting diode can be reflected to a visual angle range of a user, thereby improving brightness and a light emergent effect. Therefore, the present invention does not need to use a reflective metal on a light shielding structure to reflect light, thereby reducing a distance between adjacent micro light emitting diode structures, and further simplifying a manufacturing process and improving frame resolution. On the other hand, each light emitting surface of the micro light emitting diode structure faces a reflective surface, so as to avoid a problem that a plurality of micro light emitting diode elements share a reflective surface of a light shielding structure in the prior art, to avoid a scenario that a light emitting surface is excessively far away from a reflective surface, and to effectively improve a light emergent effect. Besides, a reflective surface of the micro light emitting diode structure of the present invention is a flat inclined surface, and by adjusting and designing angles of a light emergent surface and a reflective surface, a light travel path may be control light emitting diode, so as to improve light utilization.

The above merely describes preferred embodiments of the present invention. Equivalent variations and modifications made in accordance with the claims of the present invention shall fall within the scope of the present invention.

What is claimed is:
1. A micro light emitting diode structure, comprising:
a light emitting stacking layer, disposed on a substrate, wherein the light emitting stacking layer comprises a truncated quadrangular pyramid, the truncated quadrangular pyramid comprises a first sidewall, a second sidewall, a third sidewall and a fourth sidewall, the first sidewall is adjacent to the second sidewall and the fourth sidewall, the third sidewall is adjacent to the second sidewall and the fourth sidewall and is opposite to the first sidewall, bottom portions of the first sidewall, the second sidewall, the third sidewall and the fourth sidewall are connected on a surface of the substrate so as to form a quadrilateral, the first sidewall, the second sidewall, the third sidewall and the fourth sidewall respectively have a first angle, a second angle, a third angle and a fourth angle, which are less than 90°, with the surface of the substrate, and a top portion of the truncated quadrangular pyramid has a recess;
an insulating layer, covering the first sidewall, the third sidewall and a part of the top portion, wherein the insulating layer does not cover a bottom surface of the recess, the insulating layer has an opening at the top portion and therefore does not cover a part of the light emitting stacking layer, and the opening is disposed adjacent to the third sidewall;
a first electrode, covering the first sidewall, and a part of the insulating layer on the top portion, and covering the bottom surface of the recess; and
a second electrode, covering the third sidewall, and another part of the insulating layer on the top portion, and contacting the light emitting stacking layer through the opening.
2. The micro light emitting diode structure according to claim 1, wherein the light emitting stacking layer comprises a first type doped semiconductor layer, an active layer and a second type doped semiconductor layer that are sequentially stacked on the substrate from bottom up.
3. The micro light emitting diode structure according to claim 2, wherein the first electrode contacts the first type doped semiconductor layer via a bottom portion of the recess.
4. The micro light emitting diode structure according to claim 2, wherein the second electrode contacts the second type doped semiconductor layer via the opening.
5. The micro light emitting diode structure according to claim 2, wherein a projected area of the first type doped semiconductor layer on the substrate is greater than a projected area of the active layer on the substrate, and the projected area of the active layer on the substrate is greater than a projected area of the second type doped semiconductor layer on the substrate.
6. The micro light emitting diode structure according to claim 1, wherein the first electrode is not structurally connected to the second electrode.
7. The micro light emitting diode structure according to claim 1, wherein materials of the first electrode and the second electrode comprise a reflective metallic material.
8. The micro light emitting diode structure according to claim 7, wherein the materials of the first electrode and the second electrode independently comprise copper or silver.
9. The micro light emitting diode structure according to claim 1, wherein the first angle is equal to the third angle, and the second angle is equal to the fourth angle.
10. The micro light emitting diode structure according to claim 9, wherein the second angle and the fourth angle are in a range from 50° to 70°, and the first angle and the third angle are in a range from 50° to 70°.
11. A light emitting diode display panel, comprising:
a plurality of micro light emitting diode structures, each comprising:
a light emitting stacking layer, disposed on a substrate, wherein the light emitting stacking layer comprises a truncated quadrangular pyramid, the truncated quadrangular pyramid comprises a first sidewall, a second sidewall, a third sidewall and a fourth sidewall, the first sidewall is adjacent to the second sidewall and the fourth sidewall, the third sidewall is adjacent to the second sidewall and the fourth sidewall and is opposite to the first sidewall, bottom portions of the first sidewall, the second sidewall, the third sidewall and the fourth sidewall are connected on a surface of the substrate so as to form a quadrilateral, the first sidewall, the second sidewall, the third sidewall and the fourth sidewall respectively have a first angle, a second angle, a third angle and a fourth angle, which are less than 90°, with the surface of the substrate, and a top portion of the truncated quadrangular pyramid has a recess;
an insulating layer, covering the first sidewall, the third sidewall and a part of the top portion, wherein the insulating layer does not cover a bottom surface of the recess, the insulating layer has an opening at the top portion and therefore does not cover a part of the light emitting stacking layer, and the opening is disposed adjacent to the third sidewall;

a first electrode, covering the first sidewall, and a part of the insulating layer on the top portion, and covering the bottom surface of the recess; and a second electrode, covering the third sidewall, and another part of the insulating layer on the top portion, and contacting the light emitting stacking layer through the opening;

a first sub-pixel, comprising two first light emitting diode elements, wherein each of the first light emitting diode elements comprises one micro light emitting diode structure, and the first light emitting diode elements generate first chromatic light; and a second sub-pixel, comprising two second light emitting diode elements, wherein each of the second light emitting diode elements comprises one micro light emitting diode structure, the second light emitting diode elements generate second chromatic light, and the second chromatic light is different from the first chromatic light;

wherein the second sub-pixel and the first sub-pixel are arranged side by side, and the first sidewall or the third sidewall of any micro light emitting diode structure faces the second sidewall or the fourth sidewall of an adjacent micro light emitting diode structure.

12. The light emitting diode display panel according to claim 11, further comprising:
a common electrode line, electrically connected to the first electrodes of the micro light emitting diode structures of the first sub-pixel and the second sub-pixel; and
a plurality of signal lines, respectively electrically connected to at least one of the second electrodes of the micro light emitting diode structures of the first sub-pixel and the second sub-pixel.

13. The light emitting diode display panel according to claim 11, wherein the first sidewall of any the micro light emitting diode structures in the first sub-pixel and the second sub-pixel faces the second sidewall of another adjacent micro light emitting diode structure, and the third sidewall of the any one of the micro light emitting diode structures faces the fourth sidewall of another adjacent micro light emitting diode structure.

14. The light emitting diode display panel according to claim 11, further comprising:
a third sub-pixel, wherein the third sub-pixel comprises two third light emitting diode elements, wherein each of the third light emitting diode elements comprises one micro light emitting diode structure, the third light emitting diode elements generate third chromatic light, and the third chromatic light is different from the first chromatic light and the second chromatic light.

15. The light emitting diode display panel according to claim 14, wherein the first chromatic light is red, the second chromatic light is blue, and the third chromatic light is green.

16. A pixel unit, comprising:
a plurality of micro light emitting diode structures arranged side by side on a substrate, each comprising:
a light emitting stacking layer, disposed on the substrate, wherein the light emitting stacking layer comprises a truncated quadrangular pyramid, the truncated quadrangular pyramid comprises a first sidewall, a second sidewall, a third sidewall and a fourth sidewall, the first sidewall is adjacent to the second sidewall and the fourth sidewall, the third sidewall is adjacent to the second sidewall and the fourth sidewall and is opposite to the first sidewall, bottom portions of the first sidewall, the second sidewall, the third sidewall and the fourth sidewall are connected to each other on a surface of the substrate, so as to form a quadrilateral, the first sidewall, the second sidewall, the third sidewall and the fourth sidewall respectively have a first angle, a second angle, a third angle and a fourth angle, which are less than 90°, with the surface of the substrate, a top portion of the truncated quadrangular pyramid has a recess, and the second sidewall and the fourth sidewall are respectively light emitting surfaces of the micro light emitting diode structure;

an insulating layer, covering the first sidewall, the third sidewall and a part of the top portion, wherein the insulating layer does not cover a bottom surface of the recess, the insulating layer has an opening at the top portion and therefore does not cover a part of the light emitting stacking layer, and the opening is disposed adjacent to the third sidewall;

a first electrode, covering the first sidewall and a part of the insulating layer on the top portion, and covering the bottom surface of the recess, wherein a part of the first electrode covering the first sidewall is a reflective surface of the micro light emitting diode structure; and a second electrode, covering the third sidewall and another part of insulating layer on the top portion, and contacting the light emitting stacking layer through the opening, wherein the second electrode is not connected to the first electrode, and a part of the second electrode covering the surface of the third sidewall is a reflective surface of the micro light emitting diode structure;

wherein each of the light emitting surfaces of any of the micro light emitting diode structures faces one of the reflective surfaces of an adjacent micro light emitting diode structure, and light emitted from the light emitting surface is reflected by the reflective surface.

17. The pixel unit according to claim 16, wherein a travel direction of the light emitted through the light emitting surface and then reflected by the reflective surface comprises that the light is transmitted towards a direction opposite to the substrate.

18. The pixel unit according to claim 16, wherein the second electrodes of the micro light emitting diode structures are electrically connected to each other.

19. The pixel unit according to claim 16, wherein a quantity of the micro light emitting diode structures is an even number, and the first sidewall or the third sidewall of each of the micro light emitting diode structures faces a second sidewall or a fourth sidewall of another adjacent micro light emitting diode structure.

20. The pixel unit according to claim 19, wherein the first sidewall of each of the micro light emitting diode structures faces a second sidewall of another adjacent micro light emitting diode structure, and the third sidewall of each of the micro light emitting diode structures faces a fourth sidewall of another adjacent micro light emitting diode structure.

* * * * *